(12) United States Patent
Esmaily et al.

(10) Patent No.: US 9,301,431 B2
(45) Date of Patent: Mar. 29, 2016

(54) APPARATUS AND METHOD FOR PREVENTING COMPONENT OVERHEATING AND EXTENDING SYSTEM SURVIVABILITY

(71) Applicant: CISCO TECHNOLOGY, INC., San Jose, CA (US)

(72) Inventors: Kamran Esmaily, Sunnyvale, CA (US); Toan N. Nguyen, San Jose, CA (US); Robert E. Newhall, Cupertino, CA (US); Hsing-Sheng Liang, San Jose, CA (US)

(73) Assignee: CISCO TECHNOLOGY, INC., San Jose, CA (US)

(*) Notice: Subject to any disclaimer, the term of this patent is extended or adjusted under 35 U.S.C. 154(b) by 288 days.

(21) Appl. No.: 13/935,301

(22) Filed: Jul. 3, 2013

(65) Prior Publication Data

US 2015/0016059 A1  Jan. 15, 2015

(51) Int. Cl.
*H05K 7/20* (2006.01)

(52) U.S. Cl.
CPC ........ *H05K 7/20736* (2013.01); *H05K 7/20172* (2013.01); *H05K 7/20209* (2013.01)

(58) Field of Classification Search
CPC ................ H05K 7/20709; H05K 7/20736
See application file for complete search history.

(56) References Cited

U.S. PATENT DOCUMENTS

2013/0155612 A1* 6/2013 Korikawa .................. 361/692

* cited by examiner

*Primary Examiner* — Tuan T Dinh
*Assistant Examiner* — Mukund G Patel
(74) *Attorney, Agent, or Firm* — Patent Capital Group

(57) ABSTRACT

An example apparatus and method for preventing component overheating and extending system survivability of an appliance is provided and may include a component assembly configured to be inserted in a first slot of the appliance. The component assembly may include a door disposed on its side and extending substantially along the length of the component assembly. The door is movable between a first and a second position and the component assembly is configured so that when the component assembly is inserted in the first slot and the trap door is in the second position, the trap door provides a barrier to airflow in a second slot of the switch that is adjacent to the first slot when a second component assembly has been removed from the second slot.

20 Claims, 8 Drawing Sheets

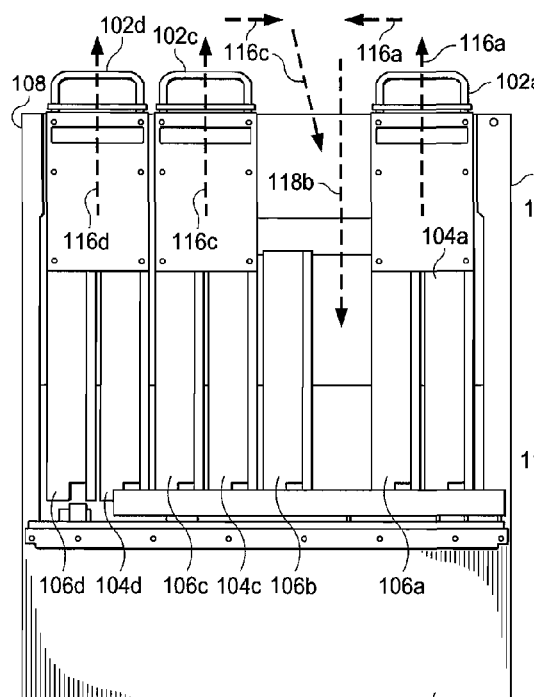
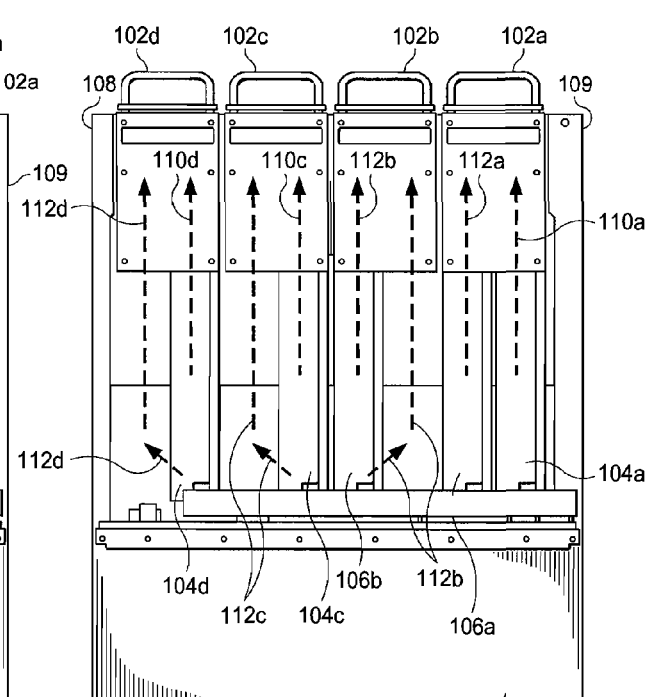
FIG. 1B
FIG. 1C

APPARATUS AND METHOD FOR PREVENTING COMPONENT OVERHEATING AND EXTENDING SYSTEM SURVIVABILITY

TECHNICAL FIELD

The present disclosure relates to architectures for electrical appliances, and, more particularly, to an apparatus and method for preventing component overheating and extending survivability of a data center switch.

BACKGROUND

Appliances such as switches and routers may be utilized within data networks for switching and routing data traffic. A data center switch may comprise switching components included in modular sections such as, for example, lines cards and supervisor engines, a mid-plane, and fabric cards. A data center switch may include a cooling system, which comprises a plurality of cooling fans arranged in a plurality of fan trays to provide air circulation to cool the switching components.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 1B and 1C are top views of the example switch of FIG. 1A showing cooling airflow patterns;

DETAILED DESCRIPTION OF EXAMPLE EMBODIMENTS

Overview

According to embodiments of the disclosure, an apparatus and method is provided for preventing component overheating and extending system survivability of an electrical appliance. In an example embodiment, a component assembly is configured to be inserted in a first slot in a switch to provide switching functionality to the switch. The component assembly may include a door disposed on its side and extending substantially along a length of the component assembly. The door may be movable between a first and a second position and the component assembly may be configured so that when the component assembly is inserted in the first slot and the trap door is in the second position, the door provides a barrier to airflow in a second slot of the switch that is adjacent to the first slot. In the embodiment, the movement of the door between the first and the second positions may be controlled by a spring mechanism and the door may be bi-directionally moveable from the first to the second position.

Another example embodiment includes a chassis configured as a structure to provide a plurality of slots adjacent to one another, a plurality of component assemblies, each for mounting in a corresponding one of the plurality of slots and each including a door moveable between a first and a second position, and one or more fans or fan trays configured to be mounted in a rear portions of the chassis and pull airflow from the chassis through the plurality of component assemblies to an outside environment of the switch. When a slot adjacent to the corresponding slot of a selected component assembly is empty, and the door of the selected component is in the second position the door forms a barrier to airflow in the second slot. An appliance into which the embodiments are implemented may include any type of appliance that includes electrical components (e.g., a switch, server, router, electronic component cabinet, network node, component assembly, etc.) that provides mounting for a plurality of component assemblies and has a cooling system that includes the circulation or convection of air. The component assembly may be any type of assembly, mechanical or otherwise, that includes relevant components for an appliance or the relevant switch. The flap door may be any type of apparatus, device or structure that is configured to provide a barrier to airflow and the slots may be any type of slot, receptacle, opening cavity, etc., formed in the appliance or switch by a chassis, structure or adjacent component assemblies, into which a component assembly may by inserted.

Example Embodiments

Figure 1A:
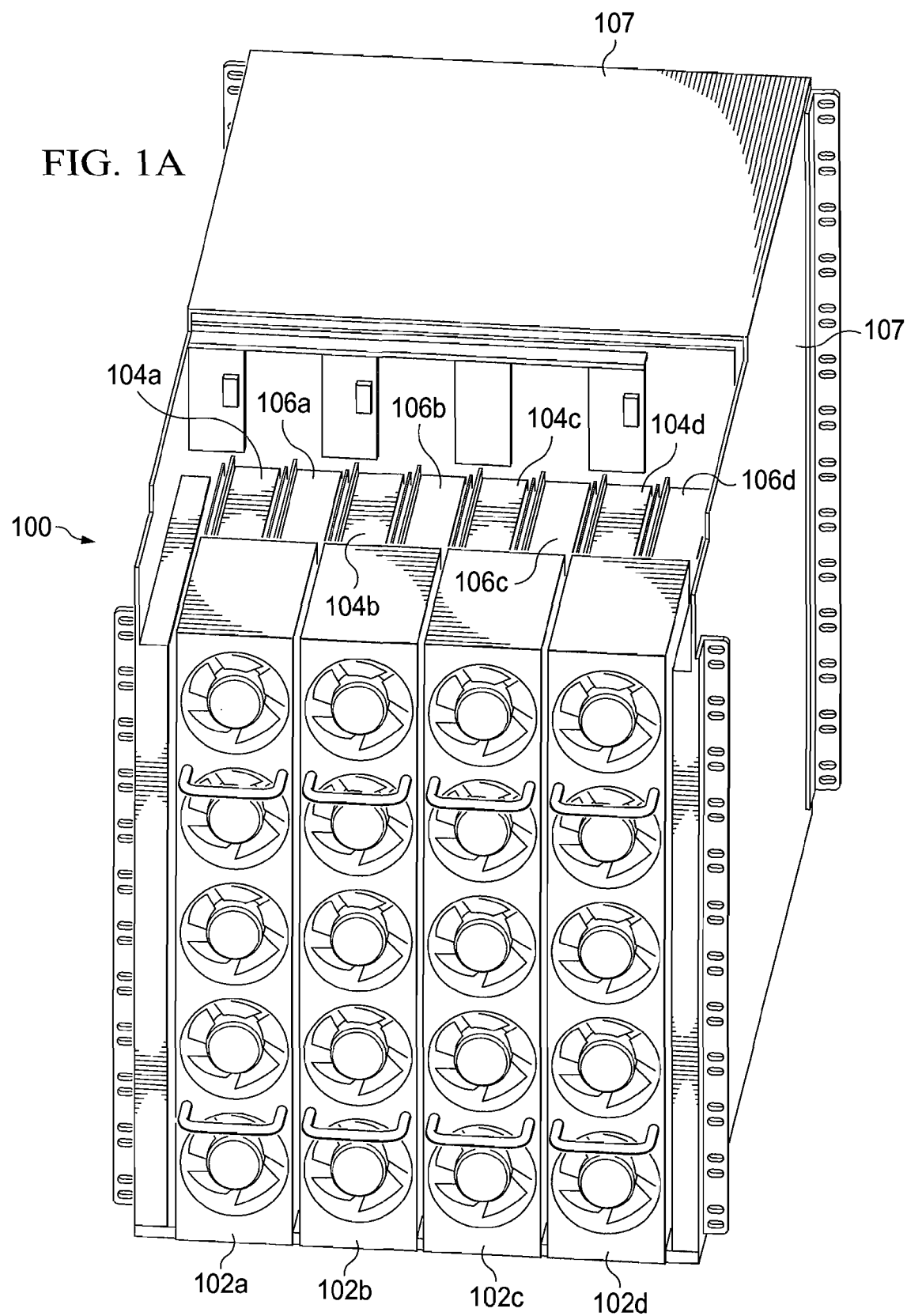
FIG. 1A is a right rear perspective view of an example switch.

FIGS. 1A-1C illustrate an example cooling system implemented in a data center switch. FIG. 1A illustrates a right rear perspective view of a data center switch 100 with the rear top cover removed. FIG. 1A shows fan trays 102(a-d) which are mounted at the rear of the switch 100, fabric cards 104(a-d) and 106(a-d), which are mounted in front of the fan trays 102(a-d), and chassis 107. Each fan tray 102(a-d) includes a plurality of fans that draw air out the rear of the switch for cooling purposes. In switch 100 of FIG. 1A, line cards and supervisor engines may be located in the front portion of the switch and mid-plane switches may be located in the center of the switch, within chassis 107.

Use of the architecture of the type shown in switch 100 of FIG. 1A may introduce problems that are caused when failed components are removed. For example, during service or replacement of a failed fabric card, the fan tray mounted at the rear of the switch behind the fabric card first should be removed and then the fabric card can be removed. Once the fabric card is removed, an airflow short circuit path to the external environment is created by the changed architecture. Air that is drawn out through fans adjacent to the removed fabric card will backflow through the empty fabric card slot, re-circulate around the mid-plane into the line cards and supervisor engines, and bypass the adjacent fabric card cards. As a result, the line cards, supervisor engines, and fabric cards will be overheated, potentially causing component failure, shorter component life, or failure of the switch itself. This overheating is caused by temperatures in the component environment that tests have shown can reach into the range of 125 to 145 degrees centigrade.

Referring to FIGS. 1B and 1C, therein are shown two scenarios in which fabric cards have been removed from switch 100. FIG. 1B shows the scenario in which fabric card 104b (the third fabric card from the right side of the figure) and fan try 102b (the second fan tray from the right side of the figure) have been removed. In this scenario, airflow exhausted by fan trays 102a and 102c, shown by broken lines 116a and 116c, respectively, backflows into the airflow shown by broken line 118b through the cavity in the empty slot created by the removal of fabric card 104b. FIG. 1C shows the situation in which fabric card 106d (the first fabric card from the left side of the figure), 106c (the third fabric card from the left side), and 104b (the third fabric card from the right side) have been removed, but all fan trays remained inserted and functioning. Switch 100 should be able to operate with at least 1 fabric card in each of the compartments separated by the fan trays. In this situation, airflow exhausted out through the empty cavity caused by the removal of a fabric card can disrupt cooling. For example, the airflow in the cavity left by the removal of fabric card 106d, shown by broken lines 112d, is pulled out through the empty cavity instead of through fabric card 104d in the airflow shown by line 110d. This can cause fabric card 104d to overheat. The situation is similar for fabric cards 104c and 106b.

Existing methods for solving airflow problems caused by failure in a switch only address fan tray failure and replacement. For example, a shutter implemented on each fan outlet or a fan tray mounted trap door, that may be closed to stop airflow through a fan if the fan fails or should be replaced are sometimes used. However, these methods do not address or solve the problems caused by fabric card failure and replacement.

Figure 2A:
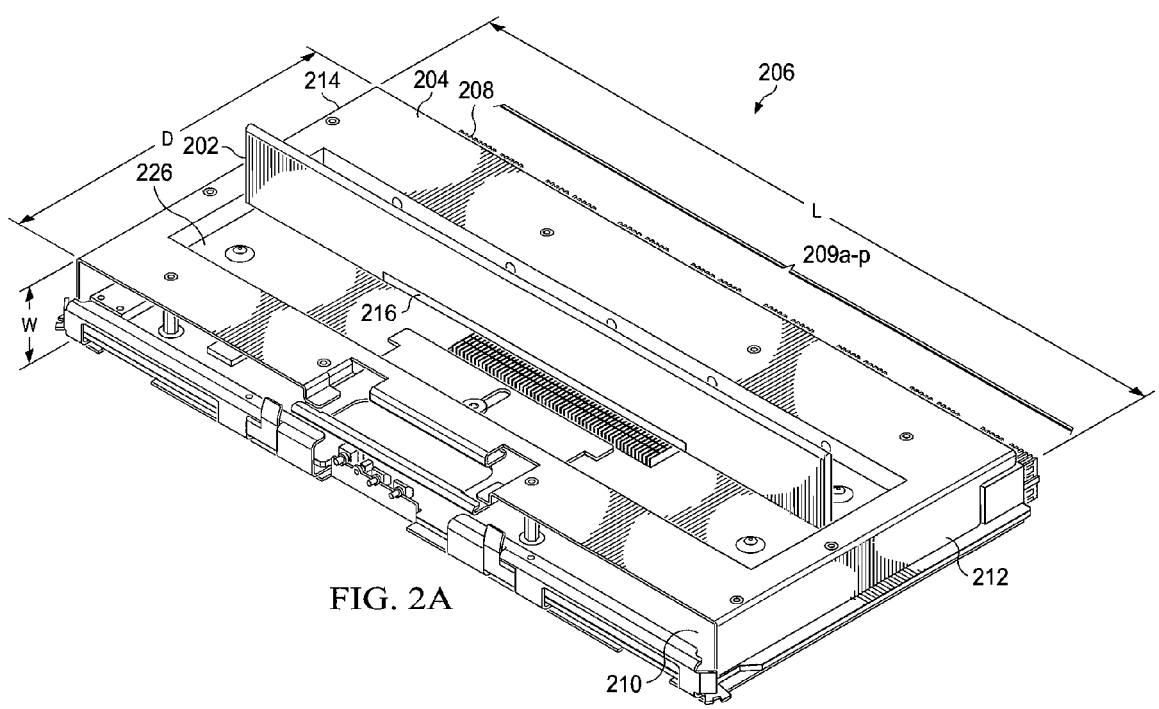
FIG. 2A is a perspective view of an example implementation of a component assembly according to an embodiment of the disclosure.
Figure 2B:
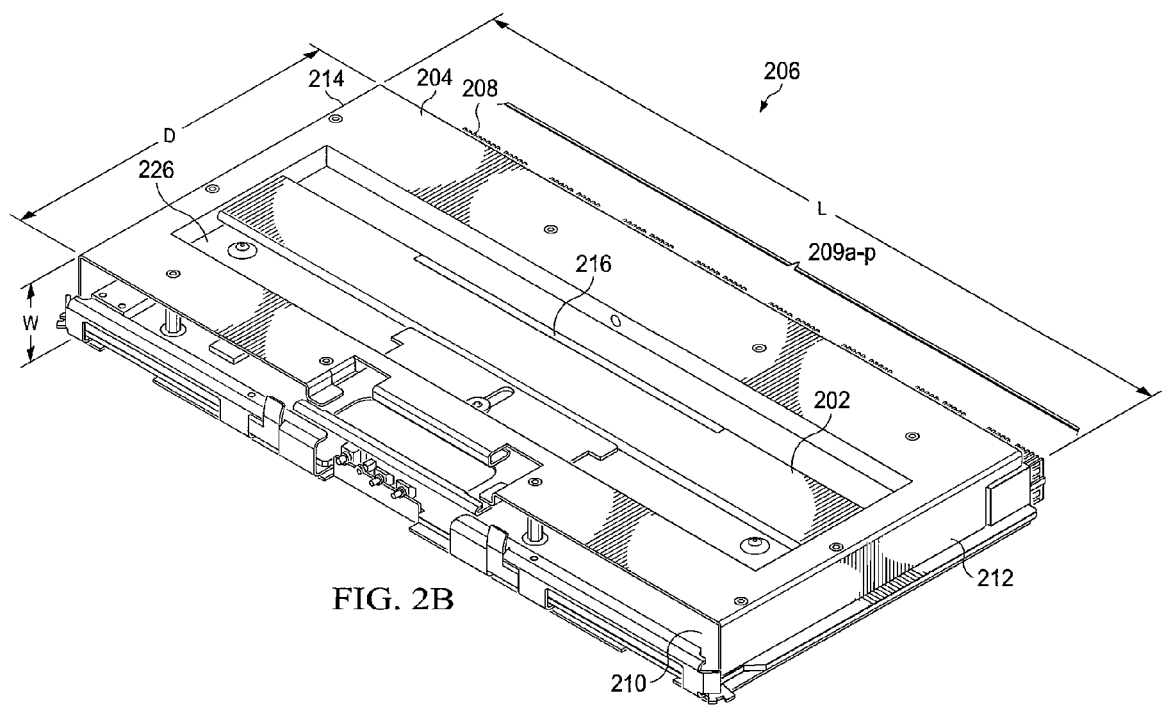
FIG. 2B is another perspective view of an example implementation of a component assembly according to an embodiment of the disclosure.

Referring now to FIGS. 2A and 2B, therein are perspective views of a component assembly of an example implementation of a component assembly according to an embodiment of the disclosure. FIGS. 2A and 2B illustrate component assembly 206 having edges 208, 210, 212 and 214, and side 204. Electrical connectors 209(a-p) are disposed on edge 208 for connecting to other components when inserted into a switch. Component assembly 206 provides switching functionality when inserted in a switch. Side 204 includes a recess 226. A door 202 is disposed on surface 204 and is mounted within recess 226. FIGS. 2A and 2B show reference dimensions labeled as L, D and W which indicate the length, depth and width, respectively, of component assembly 206. In FIG. 2A door 202 is shown in an open or extended position extending outward substantially perpendicular from surface 204. FIG. 2B illustrates door 202 in a closed or shut position. When door 202 is in the closed position, as shown in FIG. 2B, door 202 is contained within recess 226. Door 202 is shown in FIGS. 2A and 2B as extending along the length of component assembly 206. For purposes of the embodiment FIGS. 2A and 2B, door 202 may extend substantially the full length of component assembly 206. Door 202 may be implemented as a bidirectional door that can be put into a closed position within recess 226 from the open or extended position by moving door 202 in either direction about an axis along mechanism 216. In alternative embodiments door 206 may extend for an amount less than the full length of component assembly 206. Component assembly 206 also includes a mechanism 216 that controls the movement of door 202. In the embodiment, mechanism 216 may be a torsional spring mechanism that forces door 216 from the closed position shown in FIG. 2B to the open or extended position shown in FIG. 2A when door 202 is free to move. In alternative embodiments mechanism 216 may comprise any other type of mechanism that allows and controls movement of door 202 from the closed to the open or extended position. For example, mechanism 216 may be a mechanical hinge that is manually operable, or an electronic hinge that is electronically or automatically operable, or any other mechanism that provides for door 216 to be moved or positioned between first and second positions (e.g., the closed and the open position). In the example embodiment, the component assembly 206 shown in FIGS. 2A and 2B is utilized within a data center switch to implement an apparatus and method for preventing component overheating. In the example embodiment, the component assembly may comprise, for example, a fabric card for use in the data center switch.

Note that in embodiments of the present disclosure, the assembly, mechanisms, chassis, etc. be of any suitable size, shape, dimensions, placements, etc. It is imperative to note that all of the specifications, dimensions, and relationships outlined herein (e.g., height, width, length, materials, etc.) have only been offered for purposes of example and teaching only. Each of these data may be varied considerably without departing from the spirit of the present disclosure, or the scope of the appended claims. The specifications apply only to one non-limiting example and, accordingly, they should be construed as such. In the foregoing description, example embodiments have been described. Various modifications and changes may be made to such embodiments without departing from the scope of the appended claims. The description and drawings are, accordingly, to be regarded in an illustrative rather than a restrictive sense.

Figure 3A:
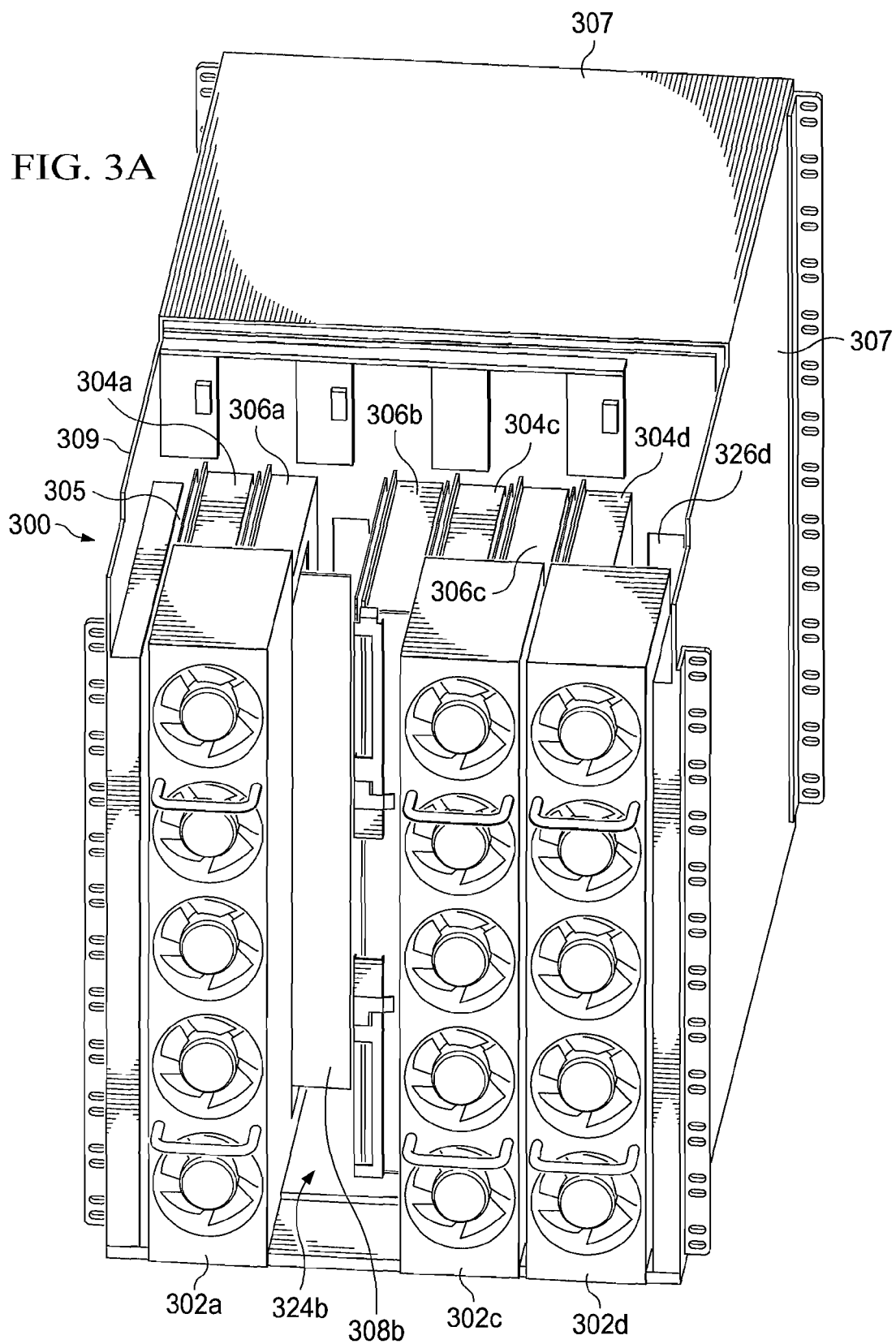
FIG. 3A is a right rear perspective view of a switch according to an example embodiment of the disclosure.
Figure 3B:
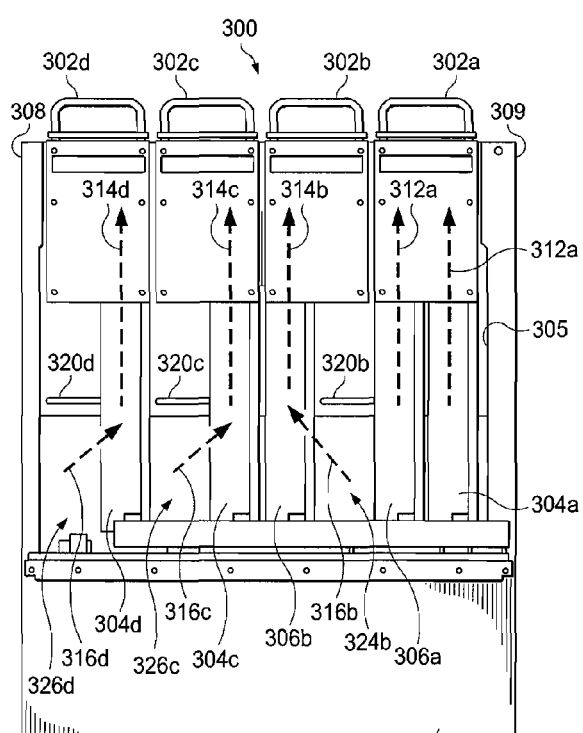
FIGS. 3B and 3C are top views of the switch of FIG. 3A showing cooling airflow patterns according to an example embodiment of the disclosure.
Figure 3C:
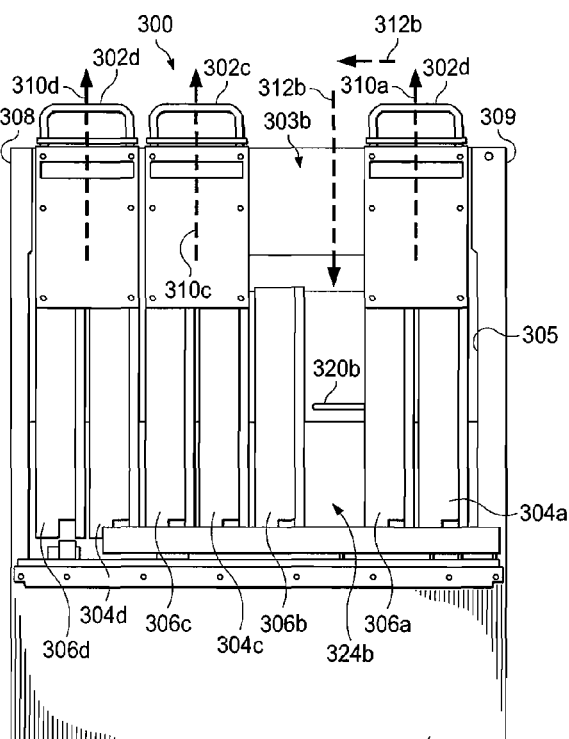
Figure 4A:
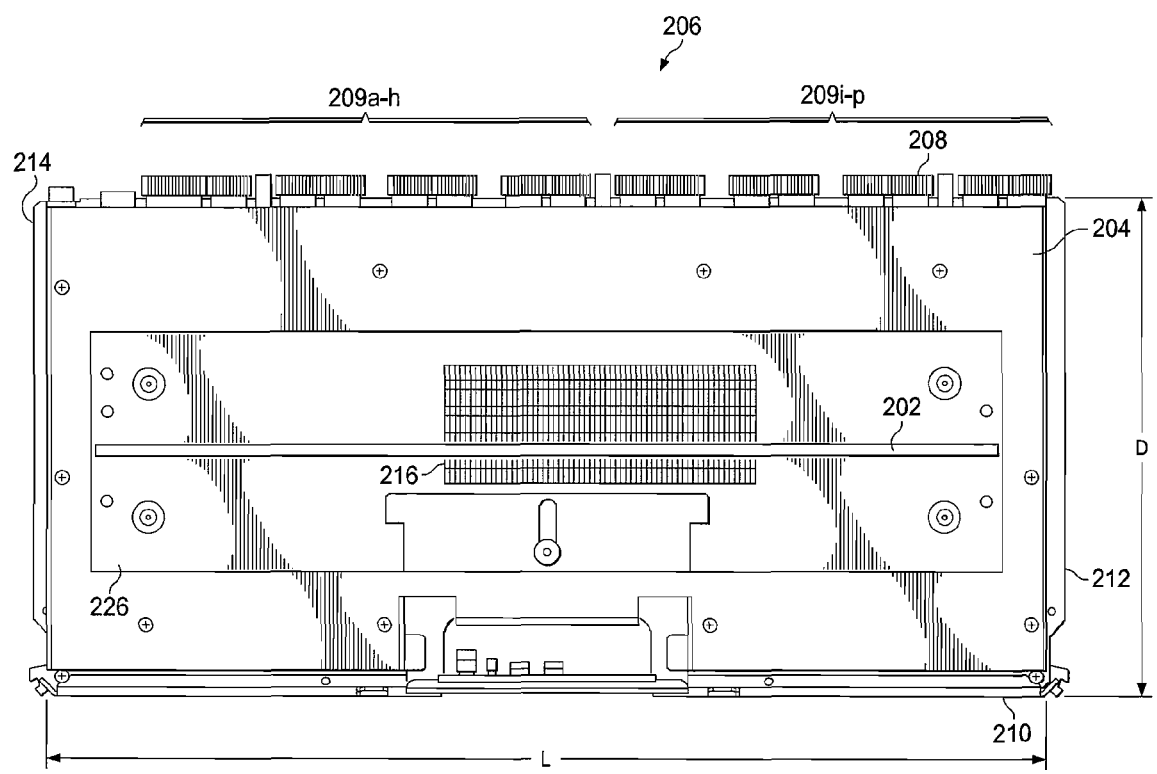
FIG. 4A is a top view of an example implementation of a component assembly according to an embodiment of the disclosure.
Figure 4B:
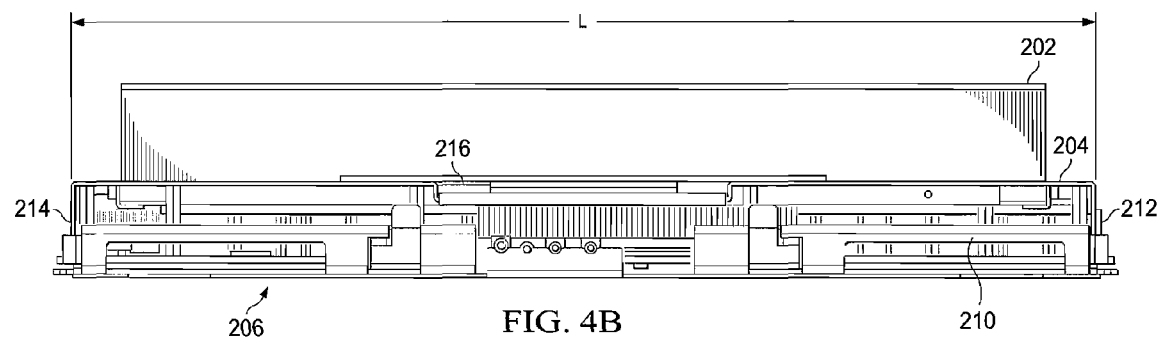
FIG. 4B is a front view of the example component assembly of FIG. 4A according to an embodiment of the disclosure; and, FIG. 4C is a right side view of the example component assembly of FIG. 4A according to an embodiment of the disclosure.
Figure 4C:
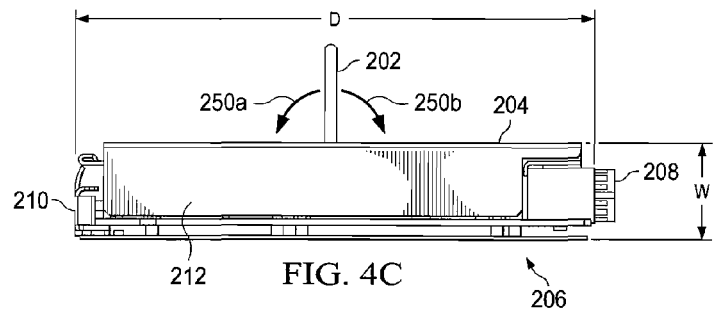

Referring now to FIGS. 4A, 4B and 4C, therein are shown additional top front and right side views of the example implementation of component assembly 206 of FIG. 2A. FIGS. 4A-4C show component assembly 206 with door 202 in the open or extended position. FIG. 4C illustrates how door 202 may be implemented in an embodiment as a bidirectional door that may be swiveled in either direction, either toward edge 210, shown by arrow 250a, or toward edge 508, shown by arrow 250b, to be put in the closed position and into recess 226. When door 202 is moved to the closed position in either direction, the torsional spring mechanism will provide pressure and attempt to force door 202 into the open or extended position. This provides flexibility in removing and inserting component assembly 206 into switch 300 when adjacent component assemblies are already in place, or in removing or inserting other component assemblies into slots adjacent to component assembly 206 when component assembly 206 is in place. In these situations door 202 will provide give and movement allowing movement of the component assemblies relative to one another Referring now to FIG. 3A, therein is shown a right rear perspective view of a switch according to an example embodiment of the disclosure. FIG. 3A shows switch 300 from a back view of switch 300. Switch 300 comprises a chassis 309 including sides 308 and 309, front top cover 310, and inner wall 305. Switch 300 is shown with its rear top cover removed to provide an internal view of component assemblies within switch 300. Switch 300 further comprises component assemblies 304a, 306a, 306b, 304c, 306c, and 304d, each inserted in a corresponding slot of switch 300, and one or more fans implemented as fan trays 302a, 302c, and 302d. Each component assembly may be implemented as the component assembly 206 of FIGS. 2A and 2B. The fans trays include fans, which draw or exhaust airflow out of switch 300 from and through the component assemblies to the external environment. The slots filled with component assemblies are not labeled in FIG. 3A. Where two component assemblies have been removed, the empty slots are shown as slot 324b and 326d. Component assemblies that have been removed will be referred to as corresponding to the reference numeral that would have been assigned if the component assembly was inserted in the slot from which it was removed in chassis 309. For example, in FIG. 3A, component assembly 304b (not shown) has been removed from slot 324b and a component assembly 306d (not shown) has been removed from slot 326d leaving slots 324b and 326d empty. In addition, a fan tray 302b has been removed from the switch allowing a view of door 308b in empty slot 324b, which is the door disposed on component assembly 306a adjacent to empty slot 324b. Door 308b is shown in the open position and is shown as providing a barrier to airflow within empty slot 324b. Referring now to FIGS. 3B and 3C, therein are top views of the switch 300 of FIG. 3A showing cooling airflow pattern scenarios according to the example embodiment of the disclosure. FIG. 3B shows a scenario for the example embodiment in which component assemblies 304b, 306c, and 306d have been removed leaving empty slots 324b, 326c, and 326d, respectively. FIG. 3B shows that doors 320b, 320c, and 320d disposed on the component assemblies 306a, 304c, and 304d, respectively, have been moved to the open position into slots, 324b, 326c, and 326d, respectively. In the embodiment, the opening of the doors may be controlled by a torsional spring mechanism implemented as mechanism 216 of FIGS. 2A and 2B. For example, when a component assembly is inserted into slot 324b, which would be in the direction of from the where fan tray 302b is mounted, the torsional spring mechanism on door 320b of component assembly 306a allows the inserted component assembly to push door 320 into the closed position. Door 320 may be forced into a recess on component assembly 306a that is implemented similarly as recess 226 is implemented on component assembly 206. The recess allows the adjacent component assembly to slide freely in the slot. Airflow through a component assembly inserted into the empty slot 324a and component assembly 306b would then be provided as fan tray 302b exhausts the airflow out of switch 300. When the inserted component assembly is removed from slot 324b, door 320b is forced to the open position by the torsional spring mechanism. The scenario would then be as shown in FIG. 3B.

In FIG. 3B, it is shown how the doors 320b, 320c and 320d provide a barrier to airflow in the respective open slots 324b, 326c and 326d, to redirect airflow to provide proper cooling for the component assemblies 306b, 304c and 304d, respectively. For example, referring to door 320b for explanatory purposes, airflow shown by broken line 316b is diverted by door 320 into the airflow shown by broken line 314b through component assembly 306b instead of flowing straight out through slot 324b. If door 320 was not open or if component assembly 306a were implemented without a door, such as door 320b, airflow would be diverted from the cooling air flow that flows through component assembly 306b and would be drawn through empty slot 324b straight out through fan tray 302b. This problem would be similar to the problem illustrated by FIG. 1C. The other doors 320c and 320d function similarly. For door 320c, airflow shown by broken line 316c is diverted by door 320c into the airflow shown by broken line 314c through component assembly 304c instead of flowing straight out through slot 326c. For door 320d, airflow shown by broken line 316d is diverted by door 320d into the airflow shown by broken line 314d through component assembly 304d instead of flowing straight out through slot 326d.

Referring now to FIG. 3C, therein is shown a scenario for the example embodiment in which component assembly 304b and fan tray 302b have been removed from switch 300. In FIG. 3C door 320 disposed on component assembly 306a is in the open position. In the scenario of FIG. 3C, door 320 forms a barrier to airflow through empty slot 324b left by the removal of component assembly 304b. The barrier formed by door 320b prevents air backflow shown by broken line 312b from flowing back into switch 30 through empty slot 324b. Instead, air backflow goes through fabric card 306b and cools fabric card 306b until fan try 302b can be replaced of repaired. If door 320 was not open, the situation would be as in FIG. 1B where the backflow 118b through the empty slot draws the exhausted hot air output by fan trays 102a and 102c back into switch 300 creating problems with overheating.

Various ferrous/alloy materials may be used in the embodiments discussed herein. In addition, other embodiments may include the use of magnetic materials, aluminums, graphites, etc. and polymers (e.g., heat resistant material, polymers, any type of plastic, synthetic rubber, etc.). Still other configurations may include certain integrations of these materials, which may be based on particular working needs, specific devices, certain frameworks, etc.

The solutions provided by the example embodiments provide an advantage in that the time available to service a removed failed components assembly or fabric card is extended as compared to a switch or appliance in which the embodiments are not implemented. This allows a longer time for repairing the failed components and may prevent the need to interrupt system operation. The maximum allowable service time allowed to remove and replace a component without interrupting system operation may be extended or removed. Serviceability and survivability are extended. The solutions also provide the advantage in that the component assemblies may be inserted in a random order of installation. For example, in the embodiment of FIG. 3A, the positions of the component assemblies in their mounting slots may be interchanged and each component assembly will function to provide the same functionality regardless of position.

The embodiment of switch 300 of FIG. 3A may also include a door similar to door 202 that is implemented in inner wall 305 of side 309. This would be necessary because if component assembly 304a were removed there would be no adjacent component assembly towards side 309 having a door that would open into the slot left empty by removal of component 304a, only the inner wall 305. In this implementation inner wall 305 may be configured so that a door is disposed on its surface similar to how door 202 is disposed on surface 204 of FIG. 2A. For example, inner wall 309 would have a recess and a door disposed in the recess. The door would be configured to run lengthwise from top to bottom (with reference to FIG. 3A) of side 309 and inner wall 305, and would be of a similar size to door 202. The door on inner wall 305 may have a torsional spring mechanism and be located so that it provides the same function as the doors of the component assemblies and would provide a barrier to airflow through the empty slot left by the removal of component assembly 304a Note that in this Specification, references to various features (e.g., elements, mechanisms, structures, modules, components, configurations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In example implementations, at least some portions of the activities outlined herein may be implemented and provided external to these elements, or consolidated in any appropriate manner to achieve the intended functionality. Note also that as used herein, the term "appliance" can include computers, network appliances, servers, routers, switches, gateways, bridges, load balancers, firewalls, processors, modules, or any other suitable device, component, network element, or object that contains components or component assemblies. Moreover, the appliances may include any suitable hardware, software, components, modules, interfaces, or objects that facilitate the operations thereof.

In a general sense, the arrangements depicted in the FIGURES may be more general in their representations, whereas a physical architecture may include various permutations, combinations, and/or hybrids of these elements. It is imperative to note that countless possible design configurations can be used to achieve the operational objectives outlined here. Accordingly, associated infrastructure has a myriad of substitute arrangements, design choices, device possibilities, hardware configurations, components implementations, equipment options, etc.

Substantial flexibility is provided by the apparatus and method in that any suitable alternative arrangements, chronologies, configurations, and alternative mechanisms may be provided without departing from the teachings of the discussed concepts.

Although the present disclosure has been described in detail with reference to particular arrangements and configurations, these example configurations and arrangements may be changed significantly without departing from the scope of the present disclosure. Moreover, although an appliance has been illustrated through the embodiment of switch 300 and has been illustrated with reference to particular elements and operations that facilitate the apparatus and method, these elements, and operations may be replaced by any suitable architecture or process that achieves the intended functionality of an appliance such as switch 300.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus comprising:
a component assembly removably inserted in a first slot of an appliance, the component assembly having a length and a side, and a door disposed on the side substantially along the length, the door being rotatable, about a hinge, between a first position, a second position, and a third position, the first position and the third position being parallel to the side, the second position being substantially perpendicular to the side, the first position being opposite to the third position, and the door being bi-directionally rotatable, about the hinge, from the second position to the first position and the third position, wherein the door, in the second position, substantially blocks airflow through a second slot of the appliance, the second slot being adjacent to the first slot and being empty, and wherein the door is rotatable from the second position to the first position to accommodate another component assembly being inserted into the second slot.

2. The apparatus of claim 1, wherein the component assembly further comprises a torsional spring configured to control rotation of the door, about the hinge, between the first position and the second position.

3. The apparatus of claim 1, wherein the first position, the second position, and the third position of the door comprise a first closed position, an open position, and a second closed position, respectively and wherein the component assembly has a recess in the side, the door is bi-directionally rotatable to the first closed position and the second closed position, and the door is contained in the recess when in the first closed position and in the second closed position.

4. The apparatus of claim 1, wherein the appliance is a data center switch and the component assembly is a fabric card assembly.

5. The apparatus of claim 1, wherein the component assembly comprises a first component assembly of a plurality of component assemblies, the apparatus further comprising:
a plurality of fan trays; and,
a chassis configured to receive the plurality of component assemblies in a plurality of corresponding slots including the first slot and the second slot, and for mounting the plurality of fan trays, wherein the plurality of fan trays draw airflow through the plurality of component assemblies to an outside environment of the apparatus when mounted in the chassis.

6. The apparatus of claim 5, wherein when the first component assembly is in the first slot and a second component assembly has been removed from the second slot, the door of the first component assembly rotates to the second position blocking airflow through the second slot.

7. The apparatus of claim 5, wherein the plurality of fan trays comprises a first fan tray drawing airflow through the second slot and the apparatus is configured so that when the first component assembly is in the first slot, and a second component assembly has been removed from the second slot, the door of the first component assembly rotates to the second position providing a barrier to airflow drawn through the second slot by the first fan tray.

8. The apparatus of claim 5, wherein the door of the first component assembly comprises a first door, and wherein the chassis comprises:
an inner wall, and
a second door disposed on the inner wall, the second door being movable between a third position and a fourth position, and the second door, in the fourth position, provides a barrier to airflow in a third slot of the appliance adjacent to the inner wall.

9. The apparatus of claim 1, wherein the door is rotatable from the second position to the third position to accommodate the component assembly being inserted into the first slot.

10. An apparatus comprising:
a component assembly mounted in a first receptacle, the component assembly comprising:
a plurality of components configured to provide electronic functionality to an appliance; and
a door disposed on a side of the component assembly, the door being rotatable, about a hinge, between a first position, a second position, and a third position, the first position and the third position being parallel to the side, the second position being substantially perpendicular to the side, the first position being opposite to the third position, the door being bi-directionally rotatable, about the hinge, from the second position to the first position and the third position, wherein the door, in the second position, substantially blocks airflow through a second receptacle of the appliance, the second receptacle being adjacent to the first receptacle and being empty, and wherein the door is rotatable from the second position to the first position to accommodate a second component assembly being inserted into the second receptacle.

11. The apparatus of claim 10, further comprising:
a chassis configured to provide a plurality of receptacles, each receptacle of the plurality of receptacles configured to receive a corresponding one of a plurality of component assemblies each configured as the component assembly of claim 10, wherein when a selected one of the plurality of component assemblies is removed from its corresponding receptacle and the door on an adjacent component assembly of the plurality of component assemblies rotates to the second position providing a barrier to airflow through the corresponding receptacle.

12. The apparatus of claim 11, wherein the each receptacle of the plurality of receptacles comprises a slot having a rectangular opening, and wherein each door of the plurality of component assemblies comprises a rectangular door configured to substantially block airflow through one of the rectangular openings of the slots.

13. The apparatus of claim 10, wherein the component assembly comprises a first component assembly and the apparatus further comprises:
a chassis comprising the first receptacle and the second receptacle;
the second component assembly mounted in the second receptacle; and
at least one fan mounted in the chassis between an outside environment of the chassis and the first receptacle and the second receptacle, wherein the fan is draws airflow through the first receptacle and the second receptacle when the first component assembly and the second component assembly are mounted in the first receptacle and the second receptacles, and the fan draws airflow through the first receptacle when the first component assembly is mounted in the first receptacle.

14. The apparatus of claim 10, wherein the appliance comprises a switch and the component assembly comprises a fabric card.

15. The apparatus of claim 10, wherein the apparatus further comprises a chassis comprising the first receptacle and the second receptacle, the chassis further comprising a front portion for mounting a plurality of fabric cards.

16. An appliance comprising:
a chassis comprising a plurality of slots each adjacent to one another;
a plurality of component assemblies each for mounting within a corresponding one of the plurality of slots and each including a door rotatable, about a hinge, between a first position, a second position, and a third position, the first position and the third position being parallel to the side, the second position being substantially perpendicular to the side, the first position being opposite to the third position, and the door being bi-directionally rotatable, about the hinge, from the second position to the first position and the third position, wherein a selected component assembly is mounted in its corresponding slot, an adjacent slot next to the corresponding slot is empty, and the door of the selected component assembly, in the second position, substantially blocks airflow through the adjacent slot, and wherein the door is rotatable from the second position to the first position to accommodate another of the plurality of component assemblies being inserted into the adjacent slot.

17. The appliance of claim 16, wherein the chassis has a rear portion, the appliance further comprising:
at least one fan configured to be mounted in the rear portion of the chassis and pull airflow from the chassis through the plurality of component assemblies to an outside environment of the appliance.

18. The appliance of claim 17, wherein the plurality of slots each form a rectangular slot, and wherein the door of each of the component assemblies comprise a rectangular door that is substantially of the dimensions of each rectangular slot.

19. The appliance of claim 17, further comprising a front portion including a plurality of fabric cards.

20. The appliance of claim 16, wherein the appliance comprises a data center switch and each of the plurality of component assemblies comprises a fabric card.

* * * * *